(12) United States Patent
Kogure et al.

(10) Patent No.: US 8,493,062 B2
(45) Date of Patent: Jul. 23, 2013

(54) METHOD FOR DETERMINING COERCIVITY OF COERCIVITY DISTRIBUTION MAGNET

(75) Inventors: Tomonari Kogure, Anjo (JP); Mayumi Nakanishi, Anjo (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/583,681

(22) PCT Filed: Mar. 15, 2010

(86) PCT No.: PCT/JP2010/054301
§ 371 (c)(1),
(2), (4) Date: Sep. 10, 2012

(87) PCT Pub. No.: WO2011/114415
PCT Pub. Date: Sep. 22, 2011

(65) Prior Publication Data
US 2013/0002240 A1    Jan. 3, 2013

(51) Int. Cl.
G01N 27/76    (2006.01)

(52) U.S. Cl.
USPC ........... 324/201; 324/205; 324/226; 324/228; 324/260; 324/262; 310/154.26; 310/156.01; 310/156.34; 310/156.43; 361/143; 361/147; 361/267

(58) Field of Classification Search
USPC ............... 324/201, 205, 207.12, 226, 228, 324/238, 260, 262; 310/46, 154.26, 156.01, 310/156.34, 156.43; 361/143, 147, 267
See application file for complete search history.

(56) References Cited

U.S. PATENT DOCUMENTS

| | | | |
|---|---|---|---|
| 4,970,621 A * | 11/1990 | Gailbreath et al. | 361/149 |
| 6,201,386 B1 * | 3/2001 | Jones et al. | 324/205 |
| 6,424,149 B1 * | 7/2002 | Takahashi | 324/209 |
| 6,868,735 B2 * | 3/2005 | Takahashi | 73/789 |
| 2008/0284422 A1 | 11/2008 | Ishio et al. | |
| 2011/0068651 A1 * | 3/2011 | Miyata et al. | 310/156.43 |
| 2011/0210810 A1 * | 9/2011 | Miyata et al. | 335/302 |

FOREIGN PATENT DOCUMENTS

| | | |
|---|---|---|
| JP | 2006-17557 | 1/2006 |
| JP | 2006-64419 | 3/2006 |
| JP | 2008-39736 | 2/2008 |
| WO | WO 2008/053921 A1 | 5/2008 |

OTHER PUBLICATIONS

International Search Report in International Application No. PCT/JP2010/054301; Mailing Date: May 25, 2010.

* cited by examiner

*Primary Examiner* — Huy Q Phan
*Assistant Examiner* — Thang Le
(74) *Attorney, Agent, or Firm* — Finnegan, Henderson, Farabow, Garrett & Dunner, LLP

(57) ABSTRACT

According to the present invention, a method for determining coercivity of a coercivity distribution magnet, whereby coercivity of each portion in the coercivity distribution magnet can be determined with good accuracy without, for example, cutting the coercivity distribution magnet into pieces and thus quality assurance can be achieved with good accuracy, is provided.
The coercivity determination method of the present invention comprises the following steps: a step of dividing a plane of a coercivity distribution magnet into a plurality of virtual plane segmented regions, placing the coercivity distribution magnet in a demagnetization-field-applying device, providing detectors for the plane segmented regions, and creating a demagnetization loss curve for each plane segmented region; a step of determining the minimum coercivity and the mean coercivity; a step of creating a coercivity distribution graph based on three hypotheses; and a step of determining the coercivity at an arbitrary position on the plane of the coercivity distribution magnet with the use of the coercivity distribution graph based on which the coercivity for each plane segmented region is determined.

2 Claims, 6 Drawing Sheets

Unit [kOe]

| 8.94 | 8.35 | 7.77 | 8.35 | 8.94 |
| 8.25 | 7.84 | 7.43 | 7.84 | 8.25 |
| 7.82 | 7.53 | 7.25 | 7.53 | 7.82 |
| 7.57 | 7.32 | 7.07 | 7.32 | 7.57 |
| 7.50 | 7.28 | 7.05 | 7.28 | 7.50 |
| 7.50 | 7.28 | 7.05 | 7.28 | 7.50 |
| 7.57 | 7.32 | 7.07 | 7.32 | 7.57 |
| 7.82 | 7.53 | 7.25 | 7.53 | 7.82 |
| 8.25 | 7.84 | 7.43 | 7.84 | 8.25 |
| 8.94 | 8.35 | 7.77 | 8.35 | 8.94 |

→ Easy magnetization direction

- 8.60–9.00
- 8.20–8.60
- 7.80–8.20
- 7.40–7.80
- 7.00–7.40

→ Easy magnetization direction

METHOD FOR DETERMINING COERCIVITY OF COERCIVITY DISTRIBUTION MAGNET

CROSS-REFERENCE TO RELATED APPLICATIONS

This application is a national phase application of International Application No. PCT/JP2010/054301, filed Mar. 15, 2010, the content of which is incorporated herein by reference.

TECHNICAL FIELD

The present invention relates to a method for determining coercivity of a coercivity distribution magnet, wherein coercivity of an arbitrary portion of a coercivity distribution magnet having a coercivity distribution is determined with good accuracy, such magnet being used for IPM motors and other products.

BACKGROUND ART

Hitherto, for determination of the demagnetization loss state of a permanent magnet constituting a vehicle drive motor such as an IPM motor, the demagnetization loss state or the residual magnetic flux density in a magnet has been determined based on the value obtained by reading the magnetic flux density at a desired site on the surface of the magnet by a gaussmeter or the like. In addition, Patent Document 1 discloses a magnetometer that can be used for magnetometry of a relatively large magnet.

As an aside, when a permanent magnet is actually examined, it is needless to say that the magnetization state in the magnet (e.g., the demagnetization loss state or the residual magnetic flux density) varies for each portion of the permanent magnet. Further, for so-called coercivity distribution magnets, coercivity is an important magnet performance factor, in addition to the magnetic flux density. Also, such a coercivity distribution magnet literally has a distribution in which coercivity varies for each portion.

In view of quality assurance of coercivity distribution magnets, it is very important to determine such coercivity distribution in a coercivity distribution magnet (i.e., coercivity of an arbitrary portion in the magnet) with good accuracy.

For instance, in one case, an optimum design is created for a coercivity distribution magnet to be embedded in an IPM motor rotor as described above such that magnetic properties of a portion of the lateral face of the magnet on the stator side are relatively improved based on the magnetic flux from the stator side.

In such case, it is very important to determine coercivity of each portion in a coercivity distribution magnet with good accuracy before the start of the in-service period or in one phase after the start of the in-service period so as to assure the quality of each desired portion of the coercivity distribution magnet to be examined with good accuracy not only for the future magnet development but also for the credibility of magnet manufacturers and manufacturers using magnets.

However, at present, a method comprising cutting a coercivity distribution magnet into pieces and determining the coercivity of each piece is merely used.

Therefore, instead of conventional coercivity determination methods wherein a coercivity distribution magnet is cut into pieces for determination of coercivity of each piece, useful methods for determining a coercivity distribution and coercivity of an arbitrary position in the magnet with good accuracy without cutting the magnet into pieces have been sought in the art.

Patent Document 1: JP Patent Publication (Kokai) No. 2006-64419 A

DISCLOSURE OF THE INVENTION

Problem to be Solved by the Invention

The present invention has been made in view of the above problems. An object of the present invention is to provide a method for determining coercivity of a coercivity distribution magnet, whereby coercivity of each portion in the coercivity distribution magnet can be determined with good accuracy without, for example, cutting the coercivity distribution magnet into pieces and thus quality assurance can be achieved with good accuracy.

Means for Solving Problem

In order to attain the above object, the method for determining coercivity of a coercivity distribution magnet of the present invention is a method for determining coercivity of a coercivity distribution magnet in which coercivity varies on a cross-sectional plane formed in the easy magnetization direction, such magnet having a coercivity distribution in which coercivity increases outward from the center of the plane, wherein the coercivity at an arbitrary site on the plane is determined, the method comprising the following steps:

a first step of dividing the plane of the coercivity distribution magnet into a plurality of virtual plane segmented regions such that the regions are formed in the easy magnetization direction, placing the coercivity distribution magnet in a demagnetization-field-applying device, providing detectors at positions corresponding to the relevant plane segmented regions, and creating a particular demagnetization loss curve for each plane segmented region based on determination results obtained by each detector;

a second step of determining the minimum coercivity $Hr_{min}$ and the mean coercivity Hcj based on the created demagnetization loss curves, designating the center position of a plane segmented region as "x1," and designating a position ±x2 (+x2 or −x2) or ±x3 (+x3 or −x3) on the right or left side of the center position for determination of the coercivity sought to be determined;

a third step of creating a coercivity distribution graph based on the following hypotheses (1) to (3) with the use of a coordinate system in which the X axis represents the distance outward from the center of a plane segmented region and the Y axis represents the coercivity at such distance:

(1) the coercivity $H_{x1}$ at the center position x1 is designated as the minimum coercivity $Hr_{min}$ on the coercivity distribution graph (2) when the coercivities at positions ±x2 and ±x3 are represented by $H_{-x2}$ or $H_{+x2}$ $_{and H-x3}$ or $H_{+x3}$, respectively, the following equation is balanced: $(H_{-x3}+H_{-x2}+H_{x1}+H_{+x2}+H_{+x3})/5$ = the mean coercivity Hcj (3) the following equation is balanced: $H_{+x2}-H_{x1}=H_{+x3}-H_{+x2}$; and a fourth step of determining the coercivity at an arbitrary position on the plane of the coercivity distribution magnet with the use of the coercivity distribution graph based on which the coercivity for each plane segmented region is determined.

The coercivity determination method of the present invention is a coercivity determination method, whereby coercivity at an arbitrary site on a plane of a coercivity distribution magnet can be precisely determined, such magnet having a coercivity distribution in which coercivity increases outward from the center of the plane, and such plane corresponding to a cross-sectional plane formed in the easy magnetization direction, that is to say, a plane that can be obtained by cutting the magnet in a direction orthogonal to the slot axis of a rotor slot in which the magnet is placed.

In a case of a coercivity distribution magnet having a rectangular plane in a planar view, one side of the plane faces to the stator side and the opposite side thereof faces to the rotor center side.

In general, in a case of a permanent magnet produced by sintering, as a result of grain boundary diffusion of a heavy rare-earth element such as dysprosium or terbium that improves magnet coercivity from the surface of the magnet. Therefore, such magnet is a coercivity distribution magnet in which coercivity decreases from the outer circumference to the center of the magnet.

Even in cases of cuboidal permanent magnets, a coercivity distribution on a cross-sectional plane at any height level tends to be almost stable. That is, it can be said that coercivity tends to increase concentrically outward from the plane center.

Accordingly, coercivity at an arbitrary position (an arbitrary position on a plane at an arbitrary height level) can be three-dimensionally determined by determining a coercivity distribution on a plane formed by cutting a coercivity distribution magnet obtained as a result of grain boundary diffusion of dysprosium or the like at a given height level and applying the distribution to a plane at an arbitrary height level of the magnet.

First, in the first step, the plane of the coercivity distribution magnet is divided into a plurality of virtual plane segmented regions such that the regions are formed in the easy magnetization direction, the coercivity distribution magnet is placed in a demagnetization-field-applying device, detectors are provided at positions corresponding to the relevant plane segmented regions, and a particular demagnetization loss curve is created for each plane segmented region based on determination results obtained by each detector.

For instance, in a case of a magnet having a rectangular plane in a planar view, such plane is divided into a plurality of strip-shaped regions such that strip-shaped virtual plane segmented regions are formed in the easy magnetization direction. Such easy magnetization direction is a direction from the center of a rotor toward a stator when, for example, a coercivity distribution magnet is placed in a rotor slot as described above.

As a demagnetization field-applying device, a soft magnetic material evaluation test apparatus (e.g., DC recording fluxmeter (TRF; Toei Industry, Co., Ltd.) or a pulse-excitation-type magnetic property measurement system) and the like can be used. A demagnetization field is applied from the outside to a coercivity distribution magnet to be examined so as to cause demagnetization loss. Thus, a demagnetization loss curve (referred to as "I-H curve" or "$4\pi$I-H curve" in some cases) can be created in a coordinate system (the second quadrant) consisting of coercivity coordinates and residual magnetic flux density (magnetization) coordinates with the use of a detector comprising a detection coil and other components.

According to the determination method of the present invention, detectors are provided to virtual plane segmented regions and a demagnetization loss curve is created for each plane segmented region corresponding to the relevant detector.

In addition, in one example, when five plane segmented regions are formed on a plane as described above, coercivity of the center segmented region is low. In such case, coercivity increases to a similar extent in upper and lower plane segmented regions adjacent to the center segmented region. Further, coercivity tends to further increase to a similar extent in upper and lower plane segmented regions adjacent to the upper and lower plane segmented regions, respectively. Specifically, when the center plane segmented region is designated as "BA1," upper and lower plane segmented regions adjacent to the center plane segmented region are designated as "BA2" and "BA3," respectively, and upper and lower plane segmented regions adjacent to the upper and lower plane segmented regions are designated as "BA4" and "BA5," respectively, the magnitude of coercivity is in the following order: BA1<BA2=BA3<BA4=BA5.

Accordingly, in the above embodiment, detectors can be provided to three sites in total corresponding to the center plane segmented region (BA1), an upper plane segmented region (BA2) adjacent to BA1, and an upper plane segmented region (BA4) adjacent to BA2. (The demagnetization loss curve for BA2 and that for BA4 can be used as that for BA3 and that for BA5, respectively.)

Next, in the second step, the minimum coercivity $Hr_{min}$ and the mean coercivity Hcj are determined based on each created demagnetization loss curve, the center position of a plane segmented region is designated as "x1," and a position ±x2 (+x2 or −x2) or ±x3 (+x3 or −x3) is designated on the right or left side of the center position for determination of the coercivity sought to be determined. More specifically, positions +x2 and +x3 are designated on the stator side of the center position x1. In addition, positions −x2 and −x3 are designated on the rotor center side in a similar manner. Accordingly, five plane positions (x1, ±x2, and ±x3) are designated for each plane segmented region.

Here, based on the created demagnetization loss curve, it is possible to designate coercivity at an inflection point at which the residual magnetic flux density starts to decrease (or a point at which a small percent of demagnetization loss of the maximal magnetic flux density is observed) as the minimum coercivity. Further, the mean coercivity can be obtained at a point at which the demagnetization loss curve intersects with the coercivity coordinate as a result of further demagnetization loss.

For instance, if demagnetization loss curves are created for three plane segmented regions using three detectors, the minimum coercivity and the mean coercivity are determined for each demagnetization loss curve.

Needless to say, coercivity increases outward on the right or left side of the center position on a plane segmented region in the following order: the center position x1 (with the smallest coercivity), position ±x2, and position ±x3.

Next, in the third step, a coercivity distribution graph is created based on the following hypotheses (1) to (3) with the use of a coordinate system in which the X axis represents the distance outward from the center of a plane segmented region and the Y axis represents the coercivity at such distance. Here, the three hypotheses are as follows: (1) the coercivity $H_{x1}$ at the center position x1 is designated as the minimum coercivity $Hr_{min}$ on the coercivity distribution graph; (2) when the coercivities at positions ±x2 and ±x3 are represented by $H_{-x2}$ or $H_{+x2}$ and $H_{-x3}$ or $H_{+x3}$, respectively, the following equation is balanced: $(H_{-x3}+H_{-x2}+H_{x1}+H_{+x2}+H_{+x3})/5$=the mean coercivity Hcj; (3) the following equation is balanced: $H_{+x2}-H_{x1}=H_{+x3}-H_{+x2}$.

Here, $H_{-x3}$ and $H_{+x3}$ are equal to each other since position −x3 and position +x3 are at the same distance from the center position. Also, $H_{-x2}$ and $H_{+x2}$ are equal to each other since position −x2 and position +x2 are at the same distance from the center position.

Therefore, substantial variables are $H_{+x2}$ and $H_{+x3}$. $H_{+x2}$ and $H_{+x3}$ are determined by equations (2) and (3) above.

In addition, in view of hypothesis (1) above that the coercivity $H_{x1}$ at the center position x1 is designated as the minimum coercivity $Hr_{min}$, a coercivity distribution graph of a linear function (e.g., $H=kx+Hr_{min}$ (x: distance from the center)) is created on an X-Y coordinate system in which the X axis represents the distance outward from the center of a plane segmented region and the Y axis represents the coercivity at such distance.

Here, equation (3) is valid based on the hypothesis that the coercivity linearly increases outward from the center of a plane segmented region. The degree of accuracy of this hypothesis significantly influences the degree of accuracy of determination results obtained by the determination method of the present invention. When this hypothesis was generated, the present inventors compared the measured values of coercivity obtained by a conventional cutting method with the coercivity values determined by the determination method of the present invention based on hypotheses (1) to (3). Thus, the present inventors obtained the demonstration results indicating that the determination error was approximately 5%. As a result, the present inventors found that the hypothesis that the coercivity obtained by equation (3) linearly increases is valid, leading to the idea of the coercivity determination method of the present invention.

Effects of the Invention

As is evident from the above descriptions, according to the method for determining coercivity of a coercivity distribution magnet of the present invention, coercivity at an arbitrary position of a coercivity distribution magnet and a coercivity distribution in a coercivity distribution magnet can be precisely determined without cutting the magnet into pieces.

DESCRIPTION OF SYMBOLS

10: Coercivity distribution magnet; A1, A2, A3, A4, and A5: Coercivity regions; BA1, BA2, BA3, and BA4: Virtual plane segmented regions; P: Demagnetization-field-applying device; and C1, C2, C3, and C4: Detectors (detection coils)

BEST MODE FOR CARRYING OUT THE INVENTION

Figure 1:
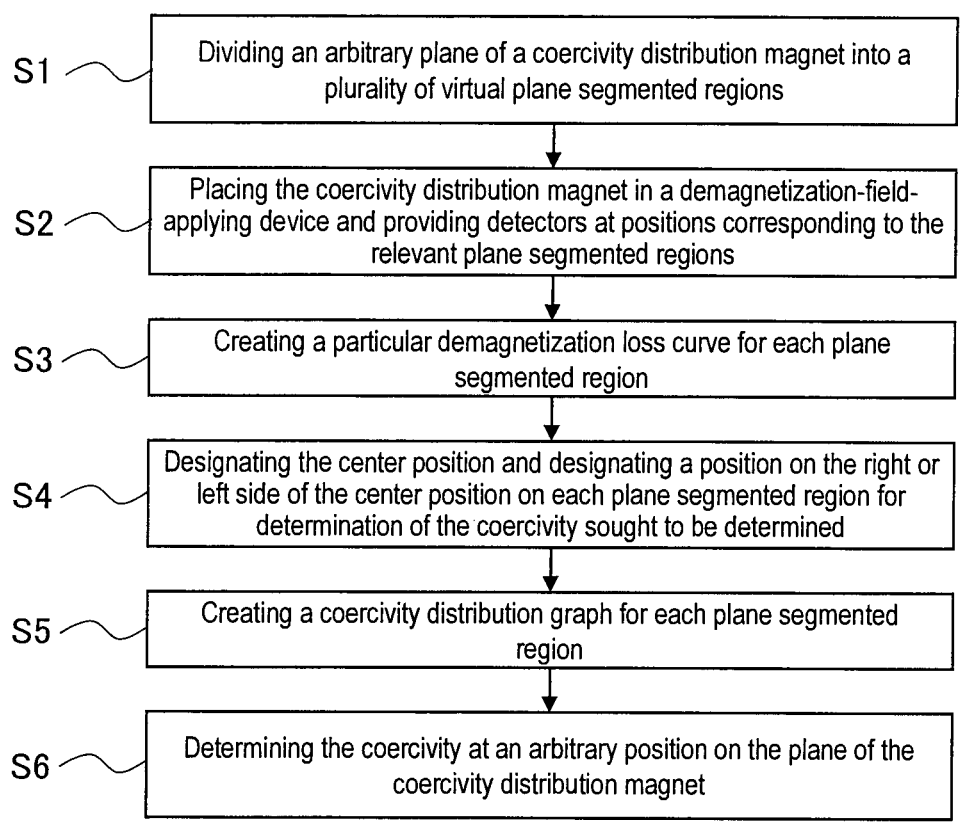
FIG. 1 is a flowchart showing the coercivity distribution determination method of the present invention.
Figure 2A:
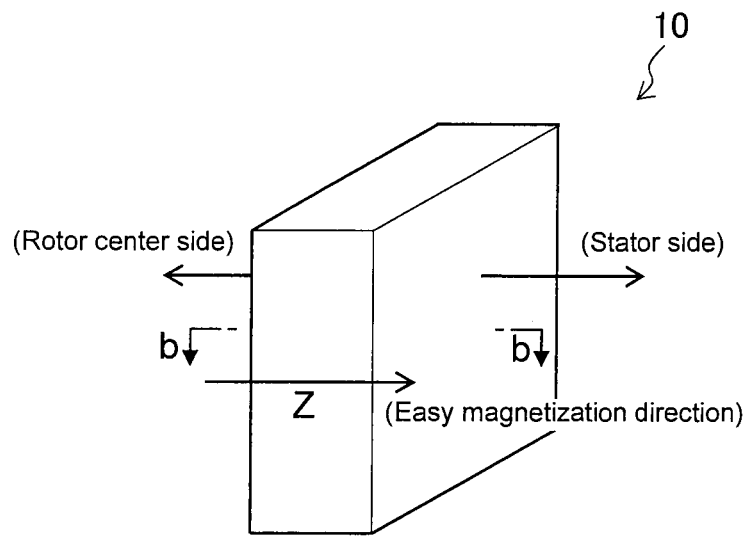
FIG. 2a shows a coercivity distribution magnet, the easy magnetization direction thereof, and the direction of the coercivity distribution magnet placed in a rotor.
Figure 2B:
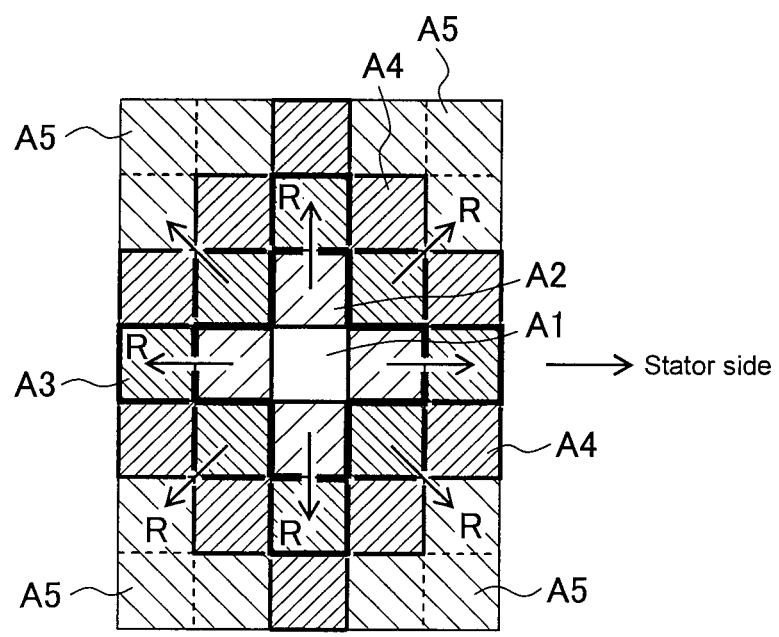
FIG. 2b shows a cross section b-b of the coercivity distribution shown in FIG. 2a. A coercivity distribution is shown in FIG. 2b.
Figure 3:
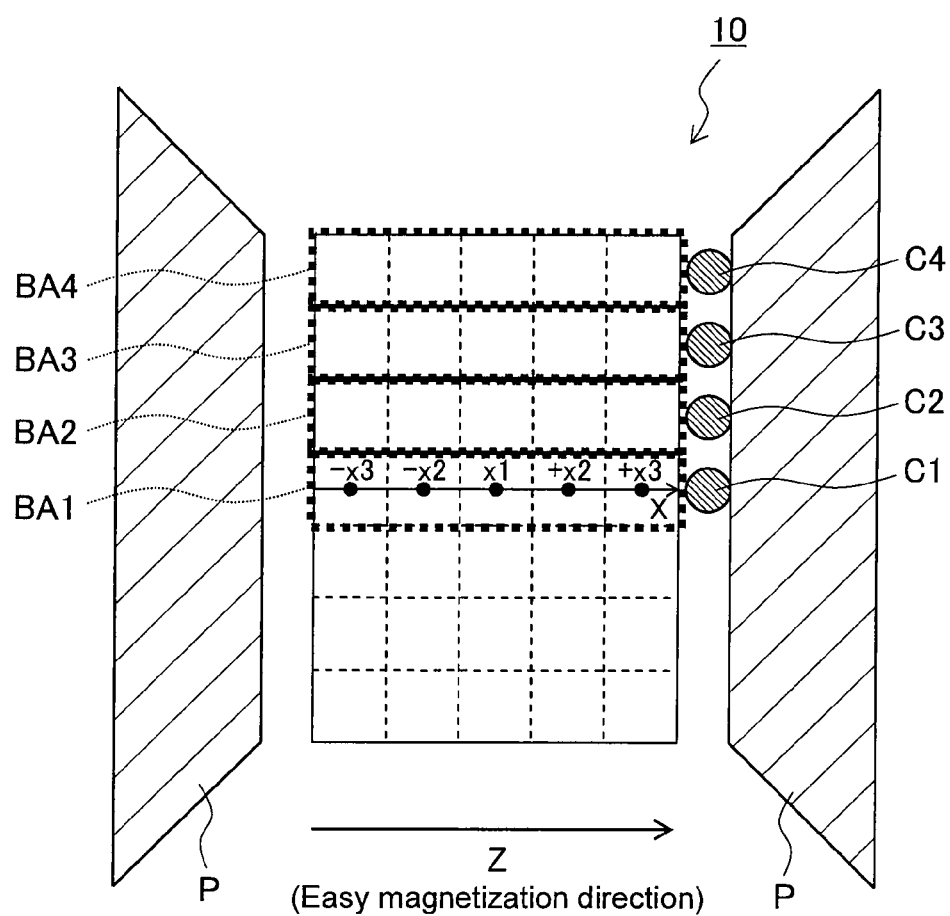
FIG. 3 is a planar view showing a situation in which the coercivity distribution magnet is placed in a demagnetization-field-applying device and detectors are placed at positions corresponding to virtual plane segmented regions.

Hereafter, embodiments of the present invention are described with reference to the drawings. FIG. 1 is a flowchart showing the coercivity distribution determination method of the present invention. FIG. 2a shows a coercivity distribution magnet, the easy magnetization direction thereof, and the direction of the coercivity distribution magnet placed in a rotor. FIG. 2b shows a cross section b-b of the coercivity distribution shown in FIG. 2a. A coercivity distribution is shown in FIG. 2b. In addition, FIG. 3 is a planar view showing a situation in which the coercivity distribution magnet is placed in a demagnetization-field-applying device and detectors are placed at positions corresponding to virtual plane segmented regions.

A coercivity distribution magnet 10 to be examined is a magnet that is embedded in a rotor that constitutes, for example, an IPM motor for driving hybrid vehicles, electric vehicles, and the like. Examples of such magnet include a three-component neodymium magnet obtained by adding iron and boron to neodymium, a samarium cobalt magnet consisting of a two-component alloy of samarium and cobalt, a ferrite magnet containing, as a main starting material, a ferrioxide powder, and an alnico magnet containing, as a starting material, aluminum, nickel, cobalt, or the like.

Here, as shown in FIG. 2a, when a coercivity distribution magnet 10 is placed in a rotor slot, the easy magnetization direction (Z direction) is specified as the direction toward the stator side. In addition, as a result of grain boundary diffusion of a heavy rare-earth element (e.g., dysprosium or terbium) that improves magnet coercivity from the surface of the coercivity distribution magnet, a coercivity distribution in which coercivity increases concentrically (R direction) outward from the center of the magnet is observed as shown in FIG. 2b.

In addition, in FIG. 2b, coercivity gradually increases outward from the center coercivity region A1 in the order of coercivity regions A2, A3, A4, and A5.

Coercivity varies at each position. However, the values of residual magnetic flux density (Br), the recoil relative permeability, and the pendent relative permeability are substantially stable at each position because a coercivity distribution magnet is entirely formed with a uniform material.

Here, the outline of the coercivity determination method of the present invention is described with reference to FIG. 1.

First, an arbitrary plane of a coercivity distribution magnet is divided into a plurality of virtual plane segmented regions (step S1).

The term "arbitrary plane" used herein refers to a cross-sectional plane formed in the easy magnetization direction, that is to say, a plane obtained by cutting a magnet 10 shown in FIG. 1a at an arbitrary height level. As shown in FIG. 3, a plurality of plane segmented regions of such arbitrary plane that are formed in the easy magnetization direction are designated as virtual plane segmented regions BA1, BA2, BA3, and BA4 starting from the center region. In addition, a plurality of plane segmented regions are formed below plane segmented region BA1. It can be assumed that coercivity distributions in these regions are similar to those in plane segmented regions BA2, BA3, and BA4.

As shown in FIG. 3, a coercivity distribution magnet 10 is placed on a demagnetization-field-applying device P of a soft magnetic material evaluation test apparatus (e.g., TRF) and particular detection coils C1, C2, C3, and C4 are provided at positions corresponding to plane segmented regions BA1, BA2, BA3, and BA4, respectively (step S2).

A demagnetization field is applied from the outside to a coercivity distribution magnet 10 so as to cause demagnetization loss. Thus, a demagnetization loss curve (I-H curve) as shown in FIG. 4a can be created in a coordinate system (the second quadrant) consisting of coercivity coordinates and residual magnetic flux density (magnetization) coordinates (step S3).

The first step of the coercivity determination method of the present invention consists of steps S1 to S3 above.

Next, the minimum coercivity and the mean coercivity in each plane segmented region are determined based on a demagnetization loss curve created for each plane segmented region. Positions +x2 and +x3 and positions −x2 and −x3 are designated on the left side and the right side (easy magnet direction) of the center position x1, respectively, for determination of the coercivity sought to be determined. Further, five virtual small blocks are determined to correspond to the above positions (step S4). The above process corresponds to the second step of the coercivity determination method of the present invention.

Figure 4A:
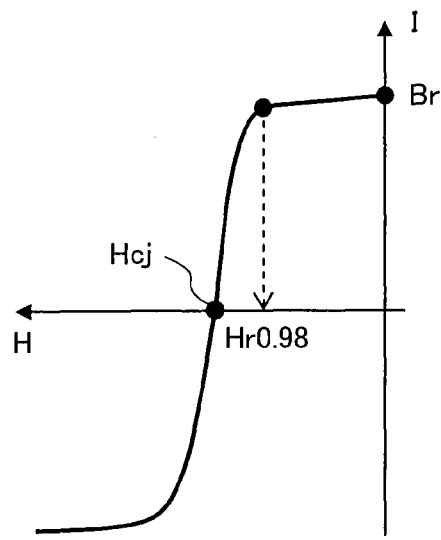
FIG. 4a shows a demagnetization loss curve in a single plane segmented region.

Here, the minimum coercivity and the mean coercivity can be determined as shown in FIG. 4a. Coercivity obtained when the maximal residual magnetic flux density (Br) decreases by a small percent (demagnetization loss) ($Hr_{0.98}$: coercivity upon demagnetization loss (2%) in FIG. 4a) is designated as the minimum coercivity $Hr_{min}$ for each plane segmented region. The crossing point of a demagnetization loss curve and a coercivity coordinate corresponds to the mean coercivity $H_{cj}$.

Such demagnetization loss curve can be created for each of plane segmented regions BA1, BA2, BA3, and BA4. The minimum coercivity $Hr_{min}$ and the mean coercivity $H_{cj}$ particular to each region are determined.

Next, the coercivity distribution graph is created for each plane segmented region (step S5).

The above coercivity distribution graph is created based on the following three hypotheses.

(1) The coercivity $H_{x1}$ at the center position x1 is designated as the minimum coercivity $Hr_{min}$ on the coercivity distribution graph.

(2) When the coercivities at positions ±x2 and ±x3 are represented by $H_{-x2}$ or $H_{+x2}$ and $H_{-x3}$ or $H_{+x3}$, respectively, the following equation is balanced: $(H_{-x3}+H_{-x2}+H_{x1}+H_{+x2}+H_{+x3})/5$=the mean coercivity Hcj.

(3) The following equation is balanced: $H_{+x2}-H_{x1}=H_{+x3}-H_{+x2}$.

Here, regarding hypothesis (2), it is also hypothesized that $H_{-x2}$ at position −x2 and $H_{+x2}$ at position +x2 are equal to each other and also $H_{-x3}$ at position −x3 and $H_{+x3}$ at position +x3 are equal to each other. Note that positions ±x2 are at the same distance from the center position on a plane segmented region and also positions ±x3 are at the same distance from the center position on a plane segmented region.

In addition, hypothesis (3) above indicates that coercivity linearly increases in the order of $H_{x1}$, $H_{+x2}$, and $H_{+x3}$.

Therefore, substantial variables are $H_{+x2}$ and $H_{-x3}$. $H_{+x2}$ and $H_{+x3}$ are determined by equations (2) and (3) above.

Figure 4B:
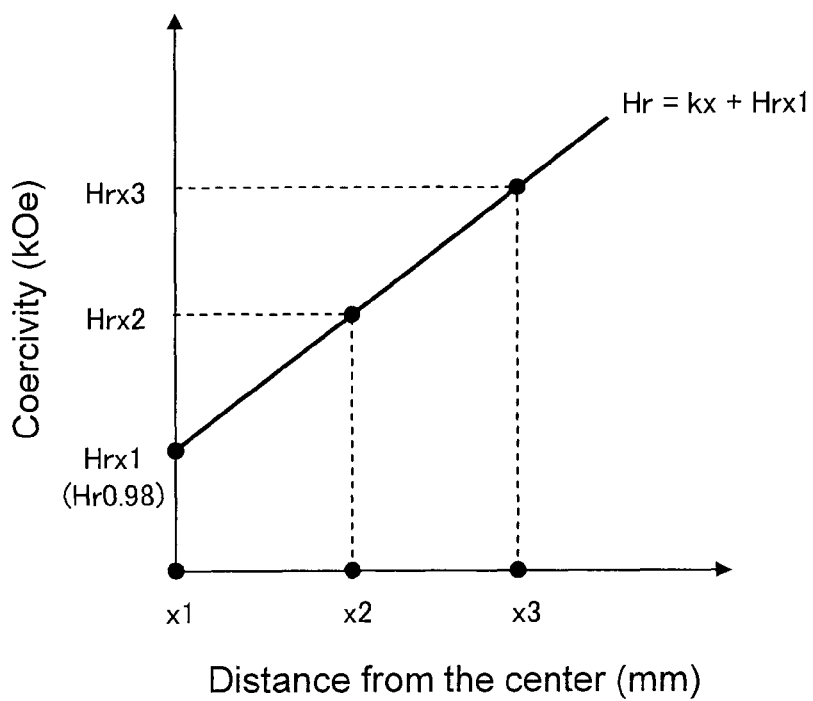
FIG. 4b is a graph showing the relationship between coercivity and the distance from the center of a plane segmented region based on hypotheses (1) and (3).

In addition, in view of hypothesis (1) above that the coercivity $H_{x1}$ at the center position x1 is designated as the minimum coercivity $Hr_{min}$, a coercivity distribution graph of a linear function (e.g., $H=kx+Hr_{0.98}$ (x: distance from the center)) is created as shown in FIG. 4b on an X-Y coordinate system in which the X axis represents the distance outward from the center of a plane segmented region and the Y axis represents the coercivity at such distance.

The above step S5 corresponds to the third step of the coercivity determination method of the present invention.

The coercivity distribution graph is created for each plane segmented region. Therefore, the coercivity at an arbitrary portion (an arbitrary portion on a two-dimensional plane) on a magnet plane of interest can be determined with the use of the coercivity distribution graphs particular to plane segmented regions BA1, BA2, BA3, and BA4 (step S6).

The above step S6 corresponds to the fourth step of the coercivity determination method of the present invention.

In addition, the coercivity at an arbitrary position on a different plane can be determined by placing a magnet on a demagnetization-field-applying device such that the height level of a plane to be examined is changed and repeating steps S1 to S6 described above in a similar manner.

Therefore, the coercivity at an arbitrary three-dimensional position in a coercivity distribution magnet can be easily determined by creating coercivity distribution graphs for planes at a plurality of height levels.

In addition, information processing described below is carried out in a computer (not shown) for creation of the demagnetization loss curves and the coercivity distribution graphs based on the three hypotheses.

Specifically, demagnetization loss curve data obtained by detectors are transmitted to a computer and thus data obtained based on the above three hypotheses are stored in the computer in which variables $H_{+x2}$ and $H_{+x3}$ are calculated such that linear coercivity distribution graph are created and stored.

On the computer display, coercivity distribution graphs of plane segmented regions BA1, BA2, BA3, and BA4 are displayed on the same screen. When an administrator inputs an arbitrary two-dimensional coordinate, the coercivity at the input coordinate is displayed.

In addition, as described above, coercivity distribution graphs are created for individual planes at a plurality of height levels and the graph data are stored in a computer. Accordingly, when an administrator inputs an arbitrary three-dimensional coordinate into the computer, the coercivity corresponding to the input coordinate can also be displayed.

[Experiments for Verifying the Accuracy of the Coercivity Values Determined by the Coercivity Determination Method of the Present Invention and the Experimental Results]

In order to verify the accuracy of the coercivity values determined by the coercivity determination method of the present invention, the present inventors obtained the coercivity values (analytical values) for a coercivity distribution magnet used as a test piece by the coercivity determination method of the present invention. In addition, the present inventors actually cut the magnet into pieces so as to obtain the measured coercivity values for the individual pieces. Then, the correlation between the analytical values and the measured values and also the errors in analytical values based on the measured values were verified.

Figure 5A:
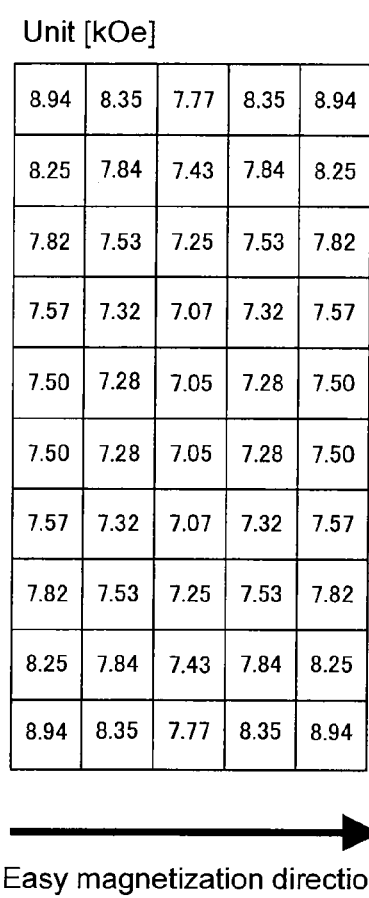
FIGS. 5a and 5b show a coercivity map created based on measurement results obtained by a cutting method.
Figure 5B:
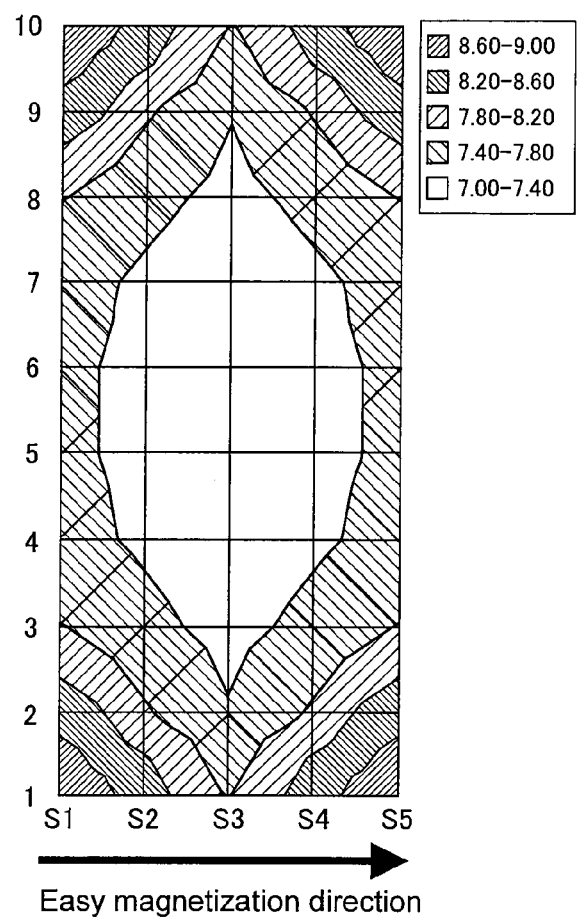

FIG. 5a is a coercivity map of measured values represented by numerical values. FIG. 5b is a contour figure of the map.

Based on FIG. 5b, it is understood that the coercivity distribution shows that the coercivity tends to increase substantially concentrically from the center of a plane to be examined.

Figure 6:
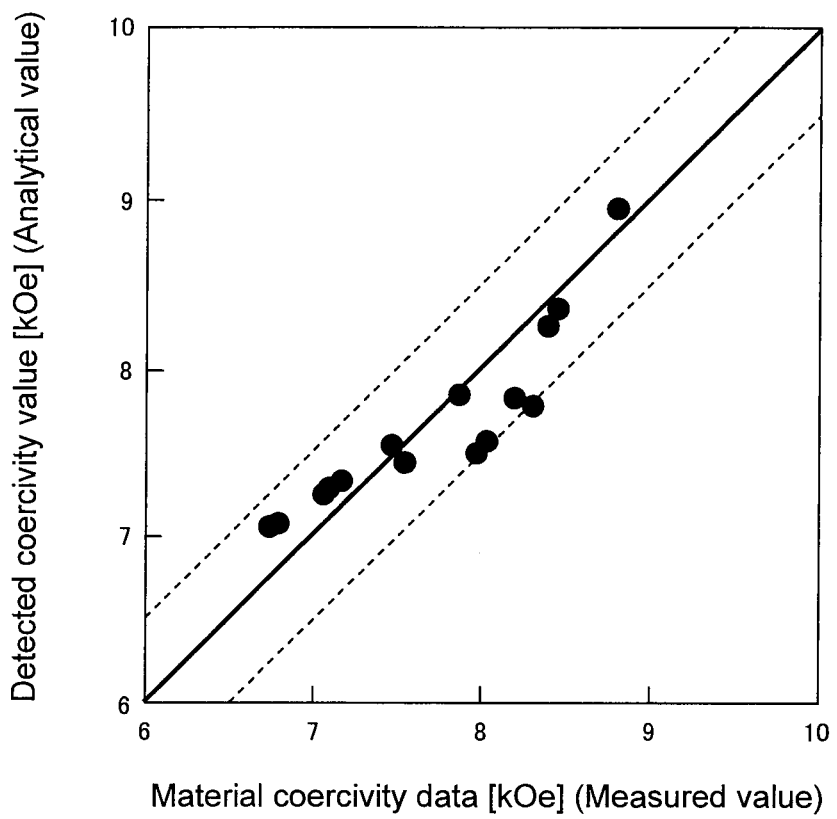
FIG. 6 is a graph showing the correlation between coercivity (analytical value) determined by the coercivity determination method of the present invention and coercivity (measured value) determined by a cutting method.

FIG. 6 shows verification results obtained by plotting the analytical values and the measured values.

There are slight errors in the analytical values compared with the measured values based on the continuous line representing the perfect correlation between the analytical values and the measured values. Specifically, there is an error of ±0.5 kOe when the coercivity ranges 7 kOe to 9 kOe. The errors in analytical values are approximately 5%.

The verification results demonstrate the validity of the coercivity determination method of the present invention, and more specifically, the validity of the three hypotheses supporting the determination method.

Based on the above analytical and experimental results, it can be guaranteed that coercivity in a magnet is determined with high accuracy by the coercivity determination method of the present invention without cutting the magnet into pieces.

The embodiments of the present invention are described above in greater detail with reference to the drawings. However, the specific configuration of the present invention is not limited thereto. Various changes and modifications to the present invention can be made without departing from the scope thereof.

The invention claimed is:

1. A method for determining coercivity of a coercivity distribution magnet in which coercivity varies on a cross-sectional plane formed in the easy magnetization direction, such magnet having a coercivity distribution in which coercivity increases outward from the center of the plane, wherein the coercivity at an arbitrary site on the plane is determined, the method comprising the following steps:

a first step of dividing the plane of the coercivity distribution magnet into a plurality of virtual plane segmented regions such that the regions are formed in the easy magnetization direction, placing the coercivity distribution magnet in a demagnetization-field-applying device, providing detectors at positions corresponding to the relevant plane segmented regions, and creating a particular demagnetization loss curve for each plane segmented region based on determination results obtained by each detector;

a second step of determining the minimum coercivity $Hr_{min}$ and the mean coercivity Hcj based on the created demagnetization loss curves, designating the center position of a plane segmented region as "x1," and designating a position ±x2 (+x2 or −x2) or ±x3 (+x3 or −x3) on the right or left side of the center position for determination of the coercivity sought to be determined;

a third step of creating a coercivity distribution graph based on the following hypotheses (1) to (3) with the use of a coordinate system in which the X axis represents the distance outward from the center of a plane segmented region and the Y axis represents the coercivity at such distance:

(1) the coercivity $H_{x1}$ at the center position x1 is designated as the minimum coercivity $Hr_{min}$ on the coercivity distribution graph (2) when the coercivities at positions ±x2 and ±x3 are represented by $H_{-x2}$ or $H_{+x2}$ and $H_{-x3}$ or $H_{+x3}$, respectively, the following equation is balanced: $(H_{-x3}+H_{-x2}+H_{x1}+H_{+x2}+H_{+x3})/5$=the mean coercivity Hcj (3) the following equation is balanced: $H_{+x2}-H_{x1}=H_{+x3}-H_{+x2}$; and a fourth step of determining the coercivity at an arbitrary position on the plane of the coercivity distribution magnet with the use of the coercivity distribution graph based on which the coercivity for each plane segmented region is determined.

2. A method for determining coercivity of a coercivity distribution magnet, wherein the distribution of coercivities at arbitrary plane positions at given height levels is determined for a coercivity distribution magnet by applying the coercivity determination method according to claim 1 to the plane that is located at an arbitrary height level of the coercivity distribution magnet, such height being perpendicular to the plane.

* * * * *